US012764904B2

(12) United States Patent
Huang

(10) Patent No.: US 12,764,904 B2
(45) Date of Patent: Oct. 13, 2026

(54) DUAL-LIQUID PUMP DUAL-CIRCULATION INTEGRATED LIQUID-COOLING DEVICE

(71) Applicant: Tsung-Hsien Huang, I-Lan Hsien (TW)

(72) Inventor: Tsung-Hsien Huang, I-Lan Hsien (TW)

( * ) Notice: Subject to any disclaimer, the term of this patent is extended or adjusted under 35 U.S.C. 154(b) by 169 days.

(21) Appl. No.: 18/741,702

(22) Filed: Jun. 12, 2024

(65) Prior Publication Data

US 2025/0358955 A1 Nov. 20, 2025

(30) Foreign Application Priority Data

May 16, 2024 (TW) ................................ 113118217

(51) Int. Cl.
*H05K 7/20* (2006.01)
*F28D 1/053* (2006.01)

(52) U.S. Cl.
CPC ..... *H05K 7/20272* (2013.01); *F28D 1/05391* (2013.01); *H05K 7/20254* (2013.01); *H05K 7/20436* (2013.01)

(58) Field of Classification Search
CPC ........... H05K 7/20272; H05K 7/20263; H05K 23/46; H05K 23/467; H05K 23/473
See application file for complete search history.

(56) References Cited

U.S. PATENT DOCUMENTS

2016/0338223 A1* 11/2016 Tsai ........................ F04D 1/003
2021/0195793 A1* 6/2021 Chen .................. H05K 7/20263
2022/0071058 A1* 3/2022 Chen ...................... B23K 31/02
2022/0170705 A1* 6/2022 Huang ...................... F01P 3/18
2022/0381516 A1* 12/2022 Huang .................... F28D 1/024
2024/0015927 A1* 1/2024 Xiao ................... F28D 1/05375

* cited by examiner

*Primary Examiner* — Frantz F Jules
*Assistant Examiner* — Martha Tadesse
(74) *Attorney, Agent, or Firm* — Che-Yang Chen; Law Office of Michael Chen

(57) ABSTRACT

A dual-liquid pump dual-circulation integrated liquid-cooling device includes a cooling radiator, two liquid pumps and a cold plate. The cooling radiator has two sets of liquid circulation systems. The two liquid pumps are used to drive the liquids in the two liquid circulation systems to circulate independently. The cold plate is combined at the bottom of the cooling radiator, so that the liquid in the two liquid circulation systems of the cooling radiator can flow into the cold plate, which can cool the processor and transfer the heat of the processor to the radiator tube set to dissipate heat.

8 Claims, 12 Drawing Sheets

DUAL-LIQUID PUMP DUAL-CIRCULATION INTEGRATED LIQUID-COOLING DEVICE

BACKGROUND OF THE INVENTION

1. Field of the Invention

The present invention relates to the technical field of liquid cooling devices, and in particular, to a dual-liquid pump dual-circulation integrated liquid-cooling device used for cooling on a processor.

2. Description of the Related Art

There are two types of cooling devices for computer processors: air cooling devices and liquid cooling devices. A cold plate of the liquid cooling device is attached to the surface of the processor. The cold liquid flows through the cold plate to remove the heat when the processor is operating, allowing the heated hot liquid to flow to the cooling radiator. The cooling radiator cools the hot liquid into cold liquid and then flows back to the cold plate, which can achieve higher cooling and heat dissipation efficiency than the air-cooling radiator.

A conventional integrated liquid cooling device has the functions of small size and easy installation. For example, as shown in Chinese Patent Publication CN116931698B and Taiwan Patent Publication TW202347085A, an integrated liquid cooling device is provided with a liquid pump, and a cold plate is provided at the lower end of the cooling radiator. When it is installed in a computer, the cold plate is attached to the surface of the processor, and the liquid pump is used to drive the internal liquid circulation through the cold plate to achieve the functions of processor cooling and heat dissipation.

When the liquid cooling device operates, it relies on the liquid pump to drive the liquid circulation flow through the cold plate to achieve the function of cooling the processor. If the liquid pump ages and the speed slows down, its cooling and heat dissipation efficiency will decrease, but the user will not be able to detect it. When the liquid pump fails completely, the entire liquid cooling device cannot operate, causing the computer to be completely unable to boot.

Therefore, how to ensure that the entire liquid cooling device can continue to operate when the liquid pump of the liquid cooling device is aged or malfunctions to avoid causing user inconvenience or computer failure is an issue that the present invention actively attempts to overcome.

SUMMARY OF THE INVENTION

The main object of the present invention is to provide a dual-liquid pump dual-circulation integrated liquid-cooling device, wherein through the dual circulation channel structure of a cooling radiator and the design of dual liquid pumps, the two liquid pumps in the dual circulation channels of the cooling radiator can independently drive the liquid to circulate and flow to the cold plate at the bottom to cool and dissipate heat from the processor. In this way, even if one of the liquid pumps ages, slows down or completely fails, the other liquid pump can still be used to continue to operate the integrated liquid cooling device, ensuring that the liquid cooling device can have cooling and heat dissipation functions.

Another object of the present invention is to provide a dual-liquid pump dual-circulation integrated liquid-cooling device, wherein through the design of the flow channel structure inside the cold plate, the two liquid pumps can independently drive the liquid circulation into the cold plate, and when the liquid flows flow into the cold plate, they are mixed together, so that the cold liquid flows evenly through the inside of the cold plate, achieving the function of two liquid circulation systems to jointly cool and dissipate heat from the processor.

Still another object of the present invention is to provide a dual-liquid pump dual-circulation integrated liquid-cooling device, wherein through the double-liquid pump design, the flow rate of the liquid flow through the cold plate is increased, thereby effectively solving the cooling efficiency required when the processor is overclocked or operated at a high level.

DETAILED DESCRIPTION OF THE INVENTION

Figure 1:
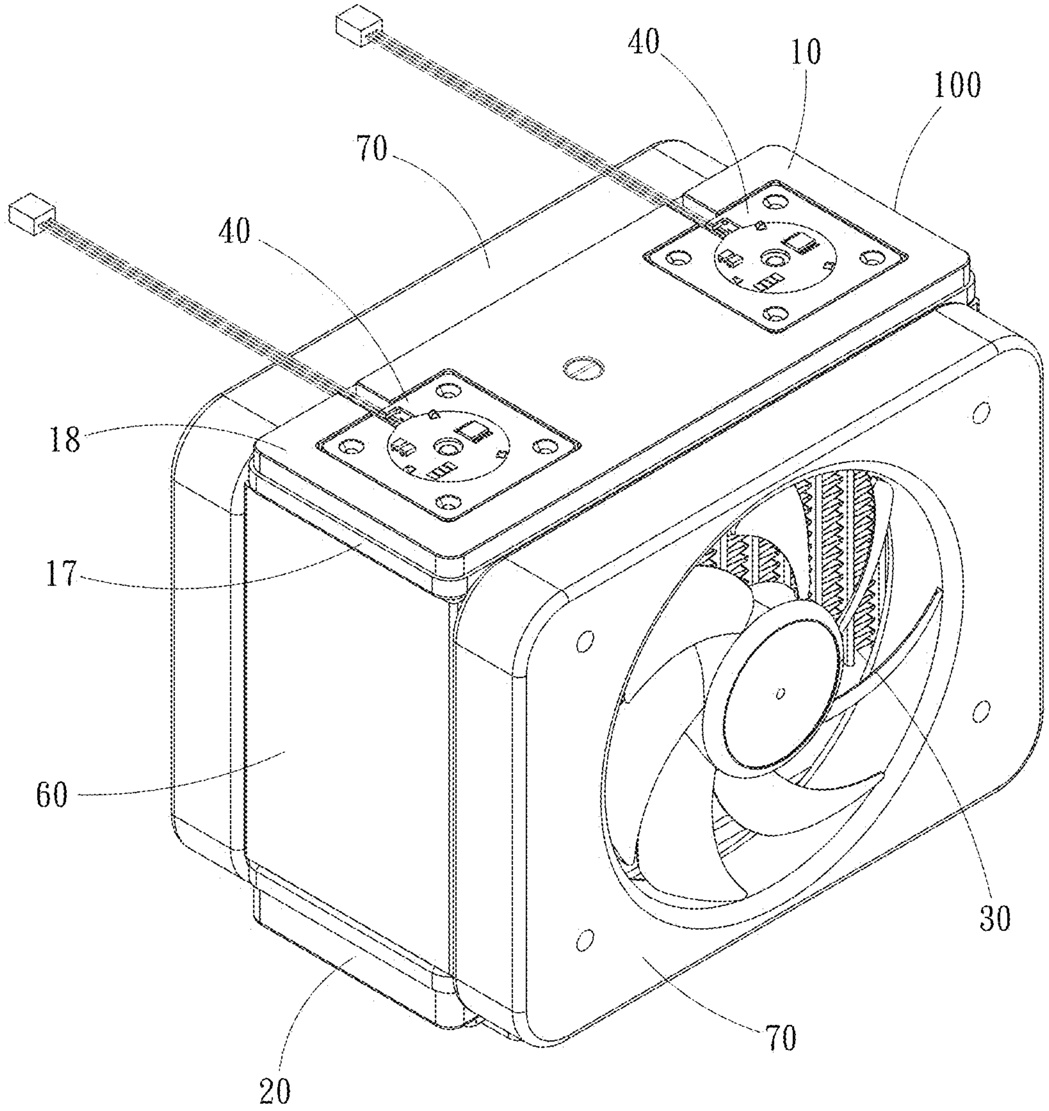
FIG. 1 is a schematic three-dimensional view of a preferred embodiment of the present invention.
Figure 2:
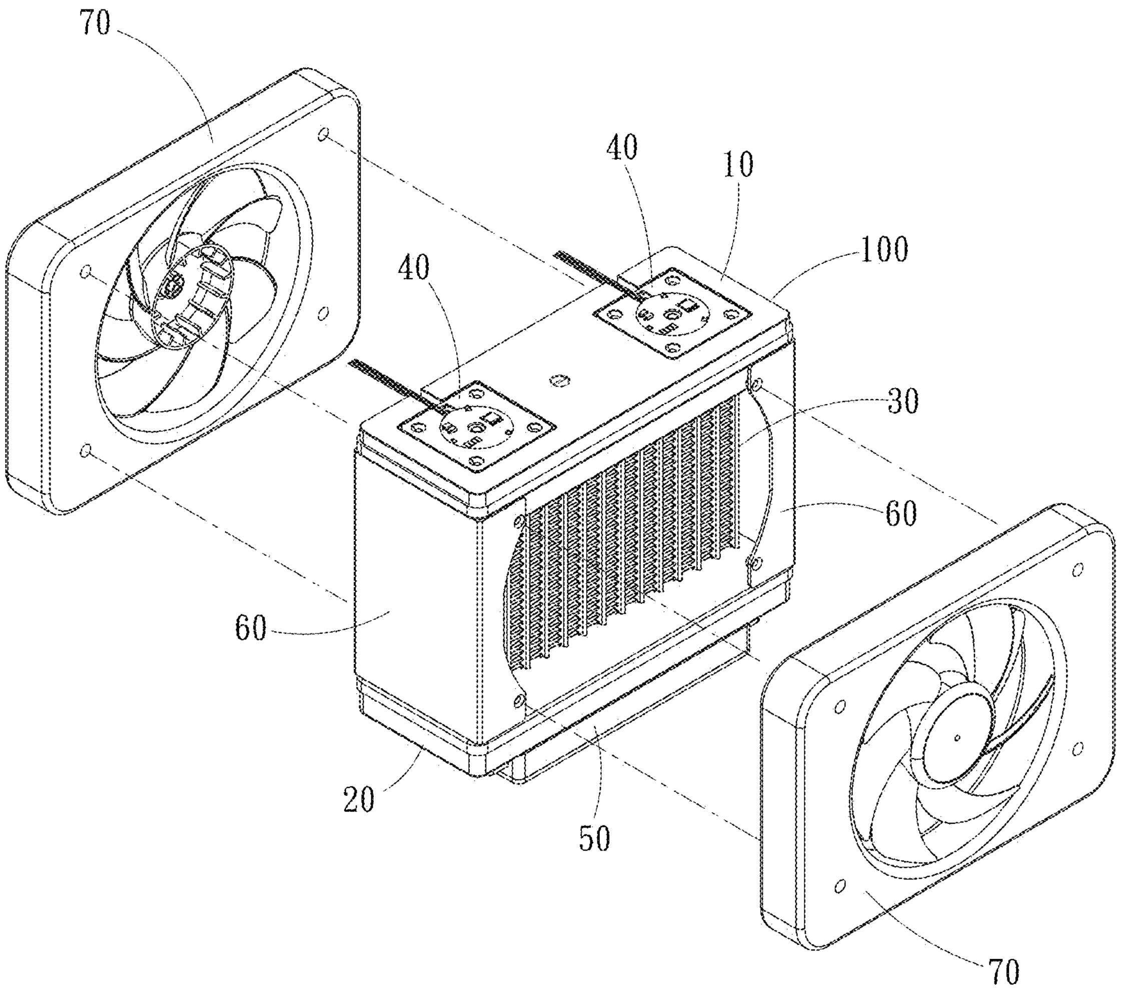
FIG. 2 is an exploded schematic diagram of the preferred embodiment of the present invention.

Referring to FIGS. 1 and 2, the invention is a dual-liquid pump dual-circulation integrated liquid-cooling device, which is used to be installed on a computer processor for cooling and heat dissipation. The preferred embodiment comprises a cooling radiator 100, two liquid pumps 40 and a cold plate 50, and can be combined with a fan 70 on one or each of both sides of the cooling radiator 100 for heat dissipation.

Figure 3:
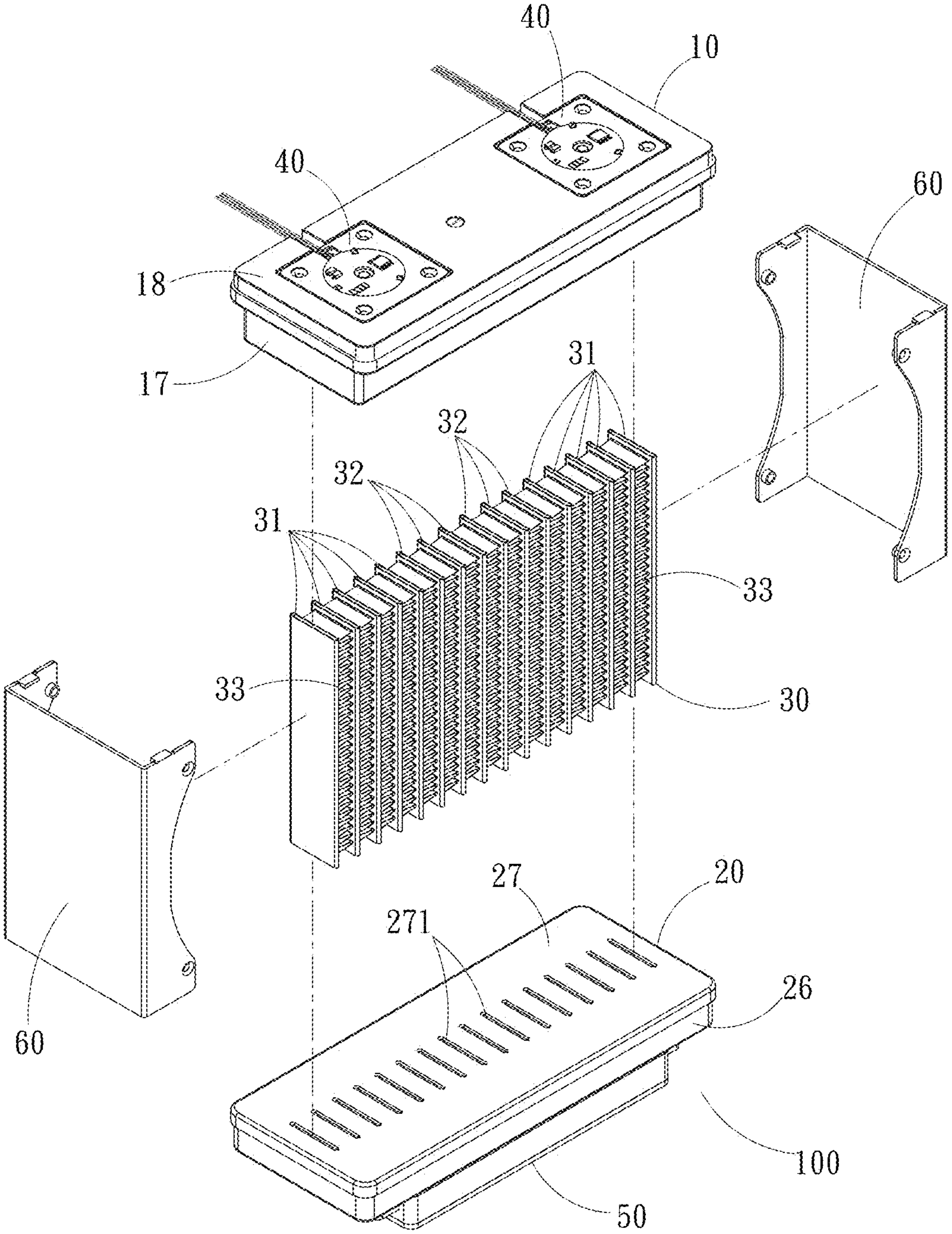
FIG. 3 is another exploded schematic diagram of the preferred embodiment of the present invention.
Figure 4:
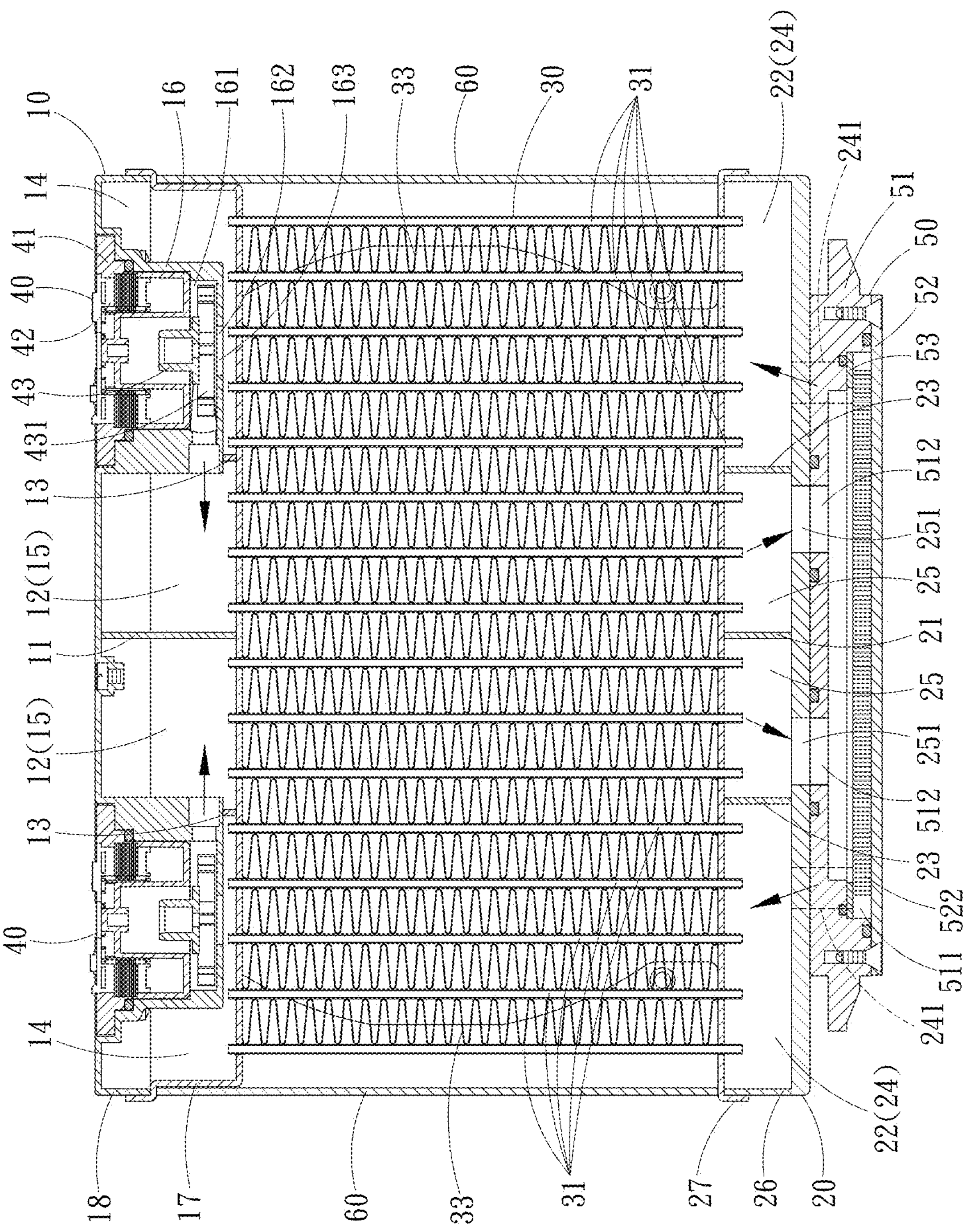
FIG. 4 is a schematic front cross-sectional view of the preferred embodiment of the present invention.
Figure 5:
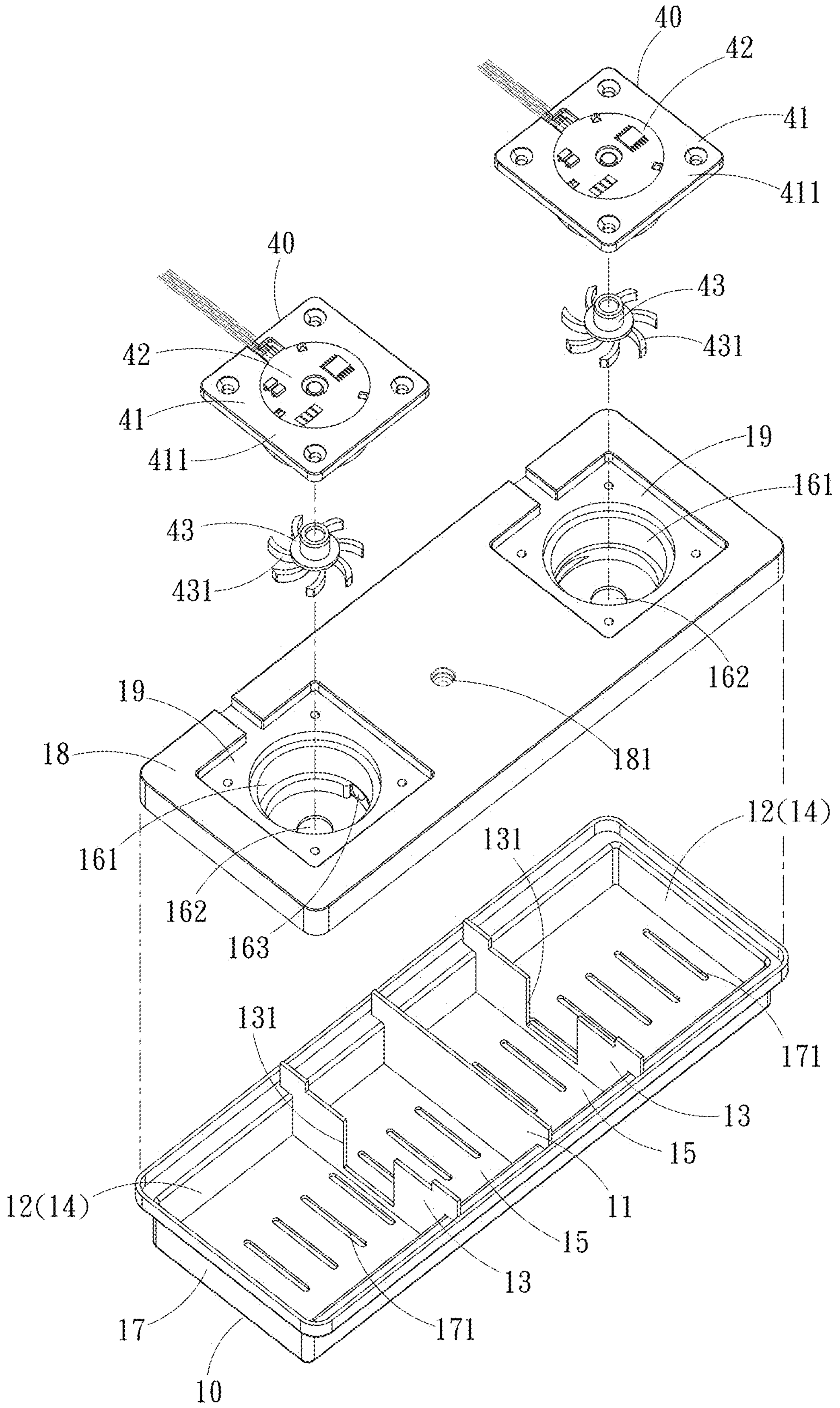
FIG. 5 is an exploded top view of the first liquid box and the two liquid pumps of the present invention.
Figure 6:
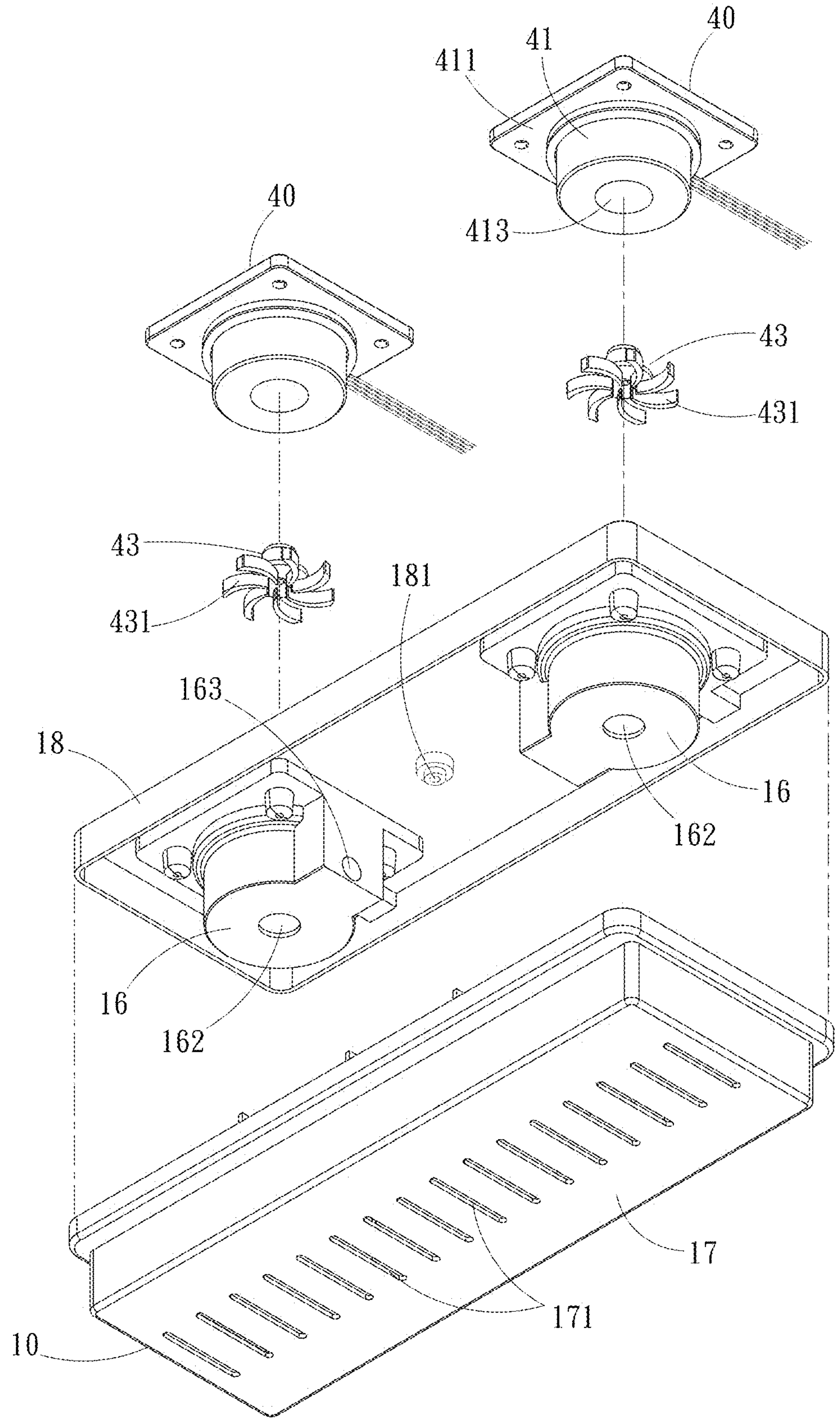
FIG. 6 is a bottom exploded schematic diagram of the first liquid box and the two liquid pumps of the present invention.

Referring to FIG. 3 and FIG. 4, the cooling radiator 100 comprises a first liquid box 10, a second liquid box 20 and a radiator tube set 30 made of aluminum alloy. Referring to FIG. 5 and FIG. 6, the first liquid box 10 is internally divided into four chambers. Specifically, it is divided into two first chambers 12 by a first partition 11. Each first chamber 12 is provided with a second partition 13 to separate it into a liquid inlet chamber 14 and a liquid outlet chamber 15. The first partition 11 and the second partition 13 are preferably welded to the inner wall of the first liquid box 10 respectively, thus forming two liquid inlet chambers 14 and two liquid outlet chambers 15 side-by-side. A liquid pump seat 16 is formed in each first chamber 12. Each liquid pump seat 16 comprises a liquid pump chamber 161, a liquid inlet hole 162 connected to the liquid pump chamber 161 and the liquid inlet chamber 14, and a liquid outlet hole 163 connected to the liquid pump chamber 161 and the liquid outlet chamber 15. Each second partition 13 has a recess 131, and the recess 131 fits on the surface of the liquid pump seat 16.

Figure 14:
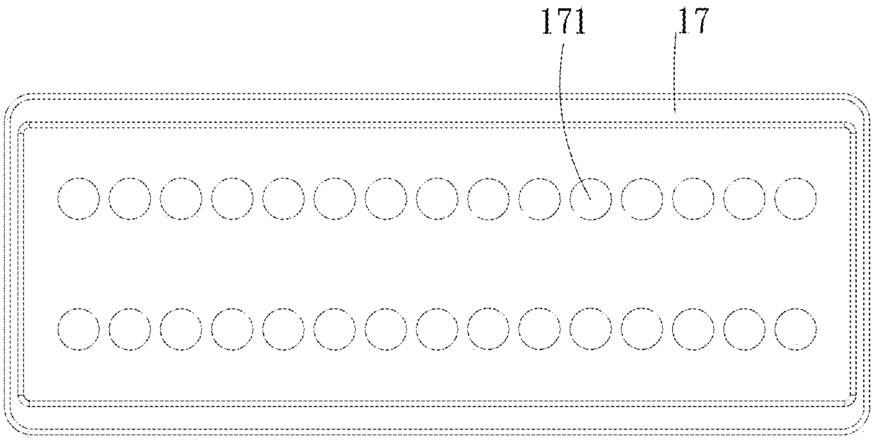
FIG. 14 is a top view of the circular radiator tube insertion holes of the present invention.
Figure 15:
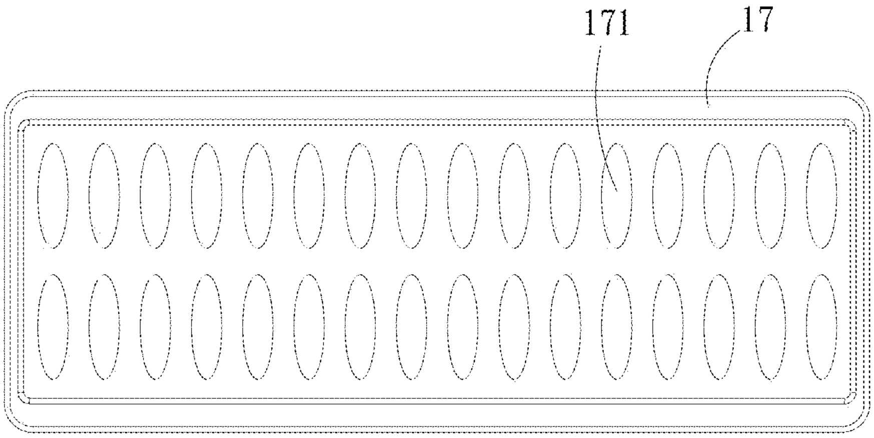
FIG. 15 is a top view of the oval radiator tube insertion holes of the present invention.

Referring again to FIG. 5 and FIG. 6, more specifically, the above-mentioned first liquid box 10 is composed of a rectangular first box body 17 and a first box cover 18. Place the first partition 11 and the two second partitions 13 into the first box body 17 from the open side, and weld the edges of the first partition 11 and the two second partitions 13 to the inner wall of the first box body 17. The bottom wall of the first box body 17 is provided with a plurality of radiator tube insertion holes 171. The radiator tube insertion holes 171 are rectangular holes, circular holes (as shown in FIG. 14) or oval holes (as shown in FIG. 15). The first box cover 18 covers the opening of the first box body 17. The liquid pump seat 16 is provided on the inner surface of the first box cover 18, and the liquid pump chamber 161 recessed into the liquid pump seat 16 is provided on the outer surface of the first box cover 18. The liquid pump seat 16 is preferably integrally formed or assembled on the inner wall of the first chamber 12 of the first liquid box 10. The liquid pump chamber 161 is recessed from the outside of the first liquid box 10 into the liquid pump seat 16. The liquid inlet hole 162 is a circular hole located in the center of the liquid pump chamber 161 and is connected to the liquid inlet chamber 14. The liquid outlet hole 163 is located on one side of the liquid pump chamber 161 and is connected to the liquid outlet chamber 15. The first box cover 18 is provided with a liquid injection hole 181 and a screw for plugging the liquid injection hole 181. The cooling liquid can be injected into the cooling radiator 100 through the liquid injection hole 181.

Figure 8:
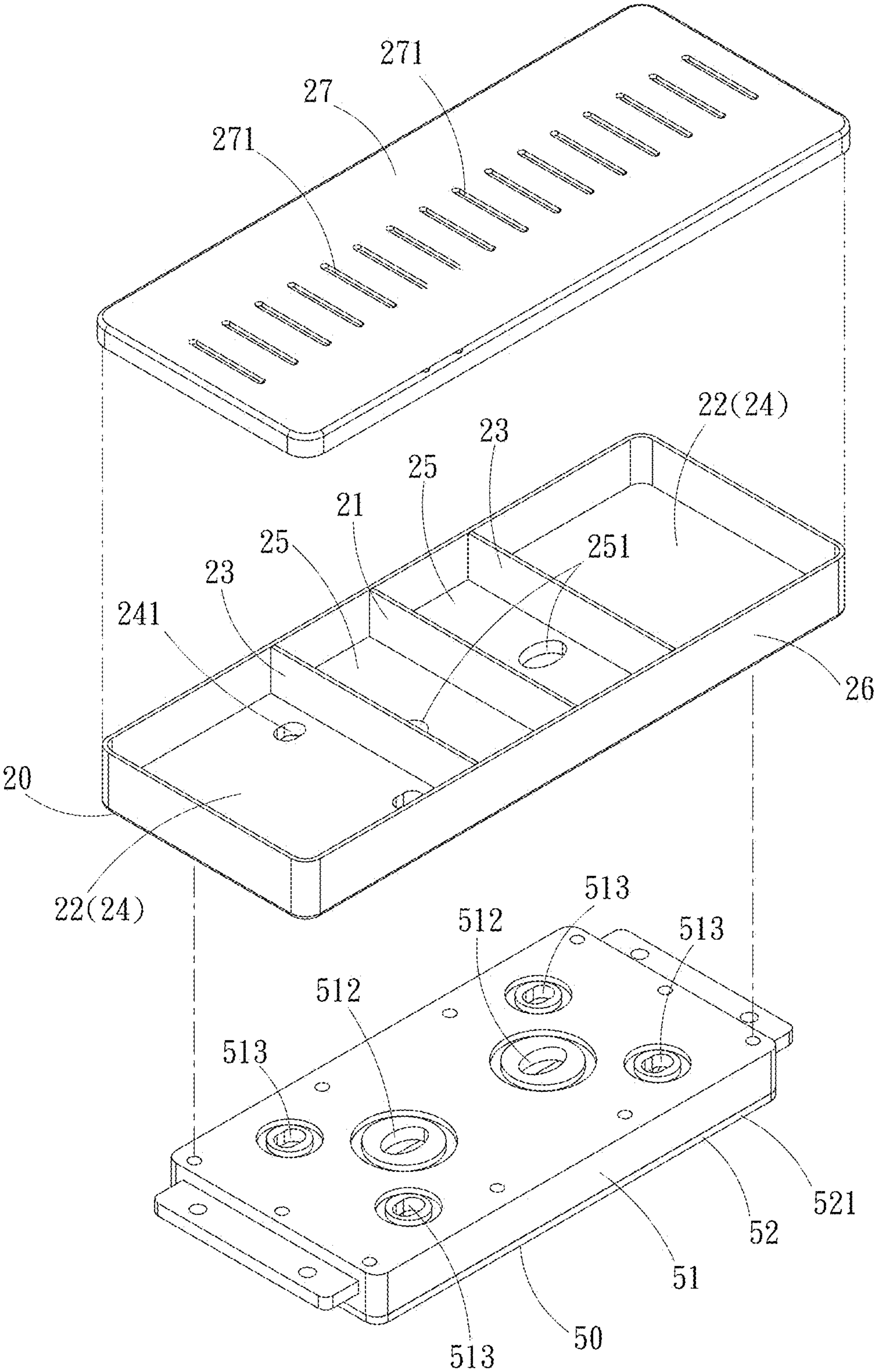
FIG. 8 is an exploded schematic diagram of the second liquid box and the liquid cooling head of the present invention.

Referring to FIG. 4 and FIG. 8, the second liquid box 20 is also divided into four chambers inside, specifically divided into two second chambers 22 by a third partition 21. A fourth partition 23 is provided in each second chamber 22 to separate it into a hot liquid chamber 24 and a cold liquid chamber 25. The third partition 21 and the fourth partition 23 are respectively welded to the inner wall of the second liquid box 20, thus forming two hot liquid chambers 24 and two cold liquid chambers 25. The hot liquid chamber 24 is provided with at least one first hot liquid outlet 241 connected to the cold plate 50 (as shown in the figure, there are two first hot liquid outlets 241 at the front and rear). The cold liquid chamber 25 is provided with a first cold liquid inlet 251 connected to the cold plate 50 in the middle. Specifically, the second liquid box 20 is composed of a rectangular second box body 26 and a second box cover 27. The third partition 21 and the two fourth partition 23 are inserted into the second box body 26 from the open side, and the edges of the third partition 21 and the two fourth partition 23 are welded to the inner wall of the second box body 26. The first hot liquid outlet 241 and the first cold liquid inlet 251 are provided on the bottom wall of the second box body 26. The second box cover 27 covers the opening of the second box body 26. The top wall of the second box covers 27 is provided with a plurality of radiator tube insertion holes 271, and the radiator tube insertion holes 271 are rectangular holes, circular holes or oval holes.

Referring to FIG. 3 and FIG. 4, the radiator tube set 30 comprises a plurality of first radiator tubes 31, a plurality of second radiator tubes 32 and a plurality of heat dissipation fins 33. The respective one ends of the first radiator tubes 31 are inserted into the selected radiator tube insertion holes 171 of the first liquid box 10 respectively, so that they are connected to the liquid inlet chambers 14 of the two first chambers 12, and the respective other ends are respectively inserted into the selected radiator tube insertion holes 271 of the second liquid box 20 to connect the hot liquid chambers 24 of the two second chambers 22. The respective one ends of the second radiator tubes 32 are respectively inserted into the other radiator tube insertion holes 171 of the first liquid box 10 to connect the liquid outlet chambers 15 of the two first chambers 12, and the respective other ends are respectively inserted into the other radiator tube insertion holes 271 of the second liquid box 20 to connect the cold liquid chambers 25 of the two second chambers 22. Thereby, the cooling radiator 100 of the present invention forms two liquid circulation systems. When the liquid in each liquid circulation system flows through the cold plate 50, it cools the processor and turns into hot liquid. The hot liquid passes through the first radiator tubes 31 and the second radiator tubes 32 to dissipate heat and become cold liquid, and then enters the cold plate 50, using this circulating flow for cooling and heat dissipation. The above-mentioned first radiator tubes 31 and second radiator tubes 32 are tube bodies with a rectangular cross-section corresponding to the radiator tube insertion holes 171 and 271, and may also be tube bodies with a circular or oval cross-section.

Figure 12:
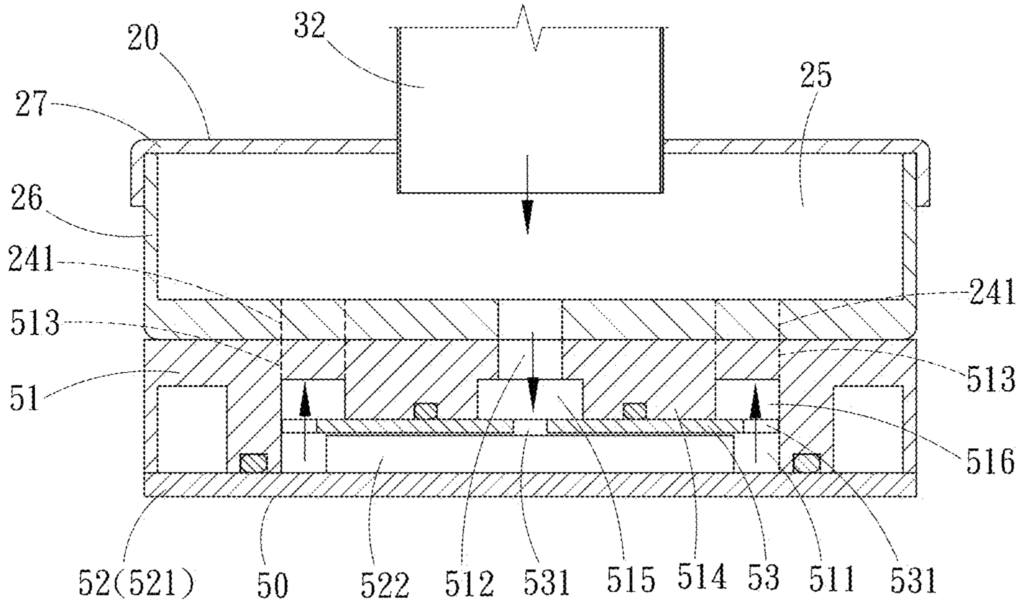
FIG. 12 is a schematic side cross-sectional view of the cold liquid in the second liquid box of the present invention flowing to the cold plate.

Referring to FIG. 4 to FIG. 7, the two-liquid pumps 40 are respectively installed in the liquid pump chambers 161 of the two first chambers 12 of the cooling radiator 100, so that the two-liquid pumps 40 are used to drive the liquids in the two liquid circulation systems of the cooling radiator 100 to circulate independently. The specific flow circuit is shown in FIG. 12. The cold liquid passing through the cold plate 50 cools the processor and becomes hot liquid. The hot liquid flows into the two hot liquid chambers 24 of the second liquid box 20 and then passes through the first radiator tubes 31 to the two liquid inlet chambers 14 of the first liquid box 10. The liquid pumps 40 then suck the liquids into the liquid pump chamber 161 through the liquid inlet holes 162, and then push the liquids to the two liquid outlet chambers 15 through the liquid outlet holes 163. Then the liquids flow through the second radiator tubes 32 to the two cold liquid chambers 25 of the second liquid box 20, so that the hot liquids pass through the first radiator tubes 31 and second radiator tubes 32 of the radiator tube set 30 to dissipate heat and become cold liquids. Then enter the cold plate 50 to cool the processor.

Figure 7:
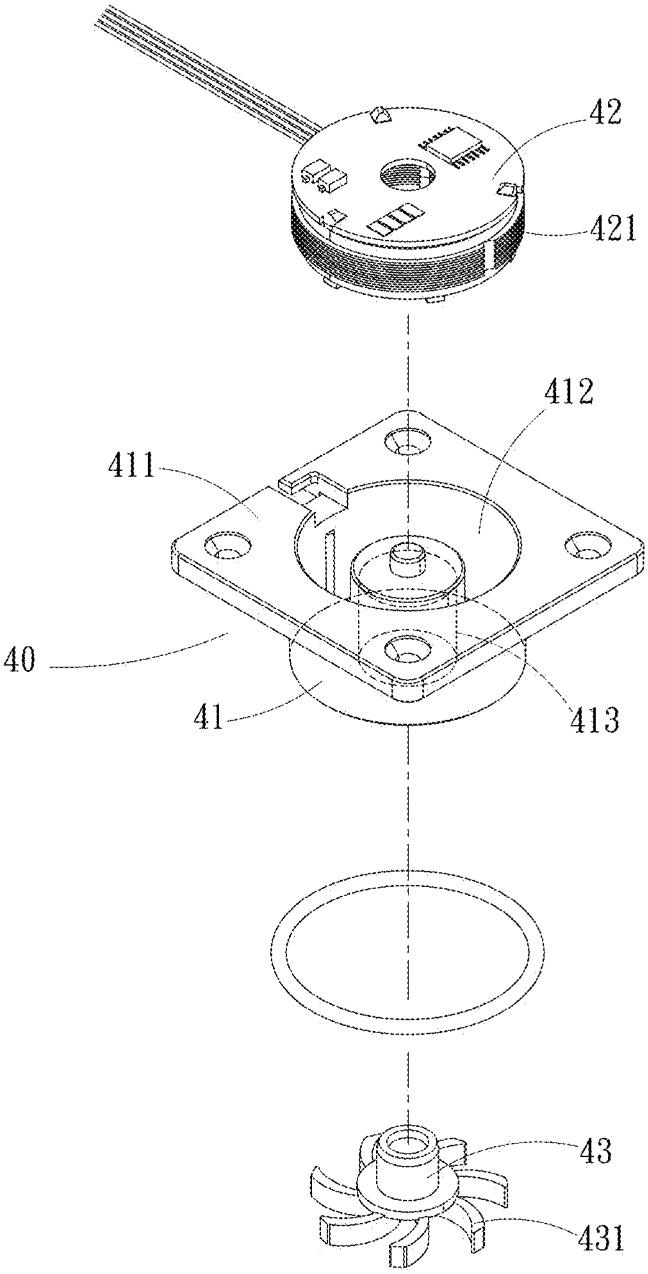
FIG. 7 is an exploded schematic diagram of the liquid pump of the present invention.

Referring to FIG. 7, the above-mentioned preferred embodiment of the liquid pumps 40 each comprise a liquid pump housing 41, a stator 42 and a rotor 43. The liquid pump housing 41 has an end cover 411, which is screwed to a groove 19 outside the first liquid box 10, so that the end cover 411 of the liquid pump housing 41 closes the liquid pump chamber 161. The liquid pump housing 41 has an annular cavity 412 on the outside and a rotor cavity 413 on the inside. The annular cavity 412 surrounds the rotor cavity 413. The stator 42 is disposed in the annular cavity 412 of the liquid pump housing 41, and has a motor coil 421 for driving the rotor 43. The rotor 43 is rotatably arranged in the associating rotor cavity 413, and has a plurality of fan blades 431 protruding outside the associating rotor cavity 413, so that the fan blades 431 of the two liquid pumps 40 rotate in the respective liquid pump chambers 161, and can suck the liquids in the respective liquid inlet chambers 14 through the respective liquid inlet holes 162, and then push the liquids to the respective liquid outlet chambers 15 through the respective liquid outlet holes 163.

Figure 9:
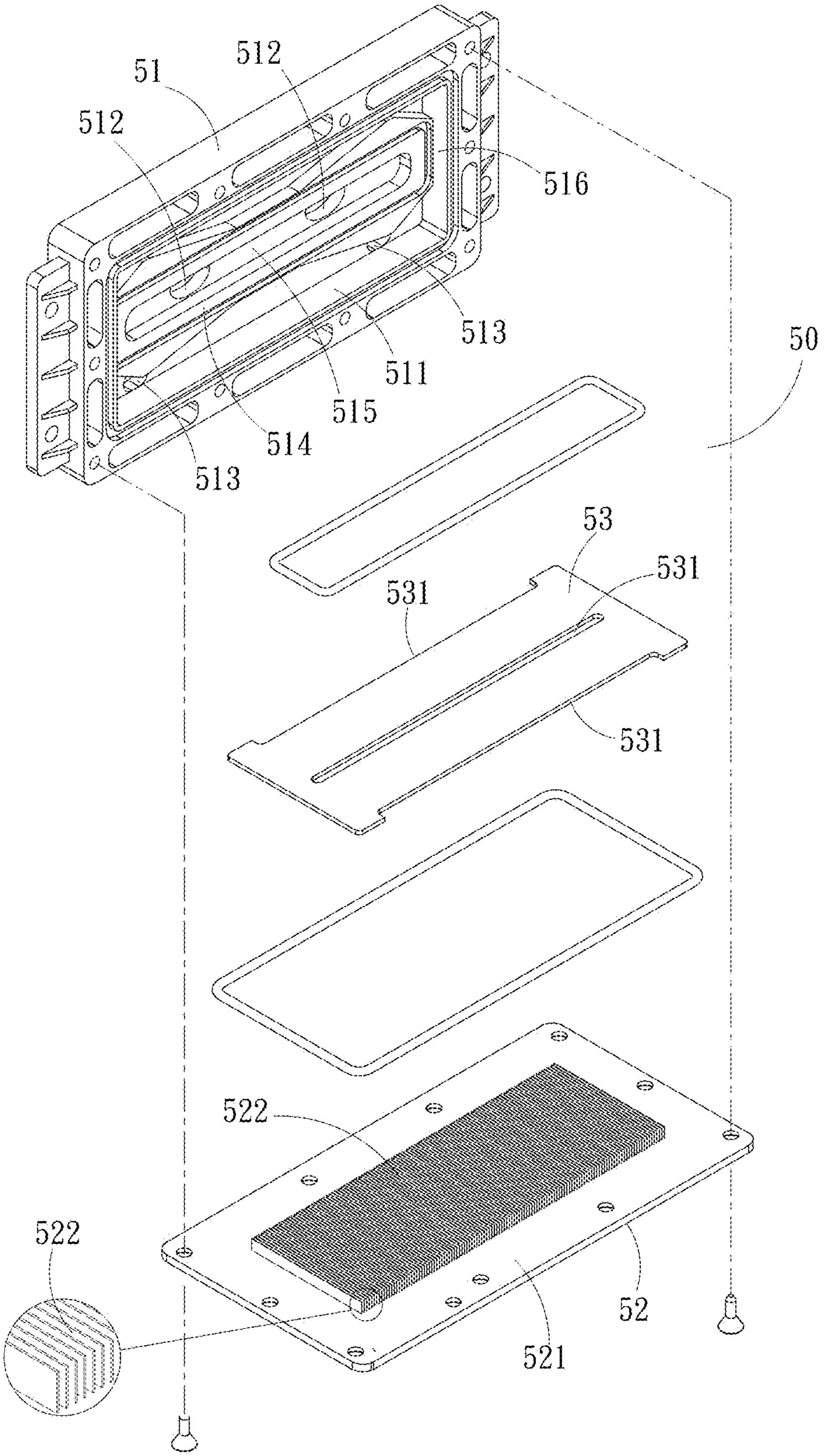
FIG. 9 is an exploded schematic diagram of the cold plate of the present invention.
Figure 10:
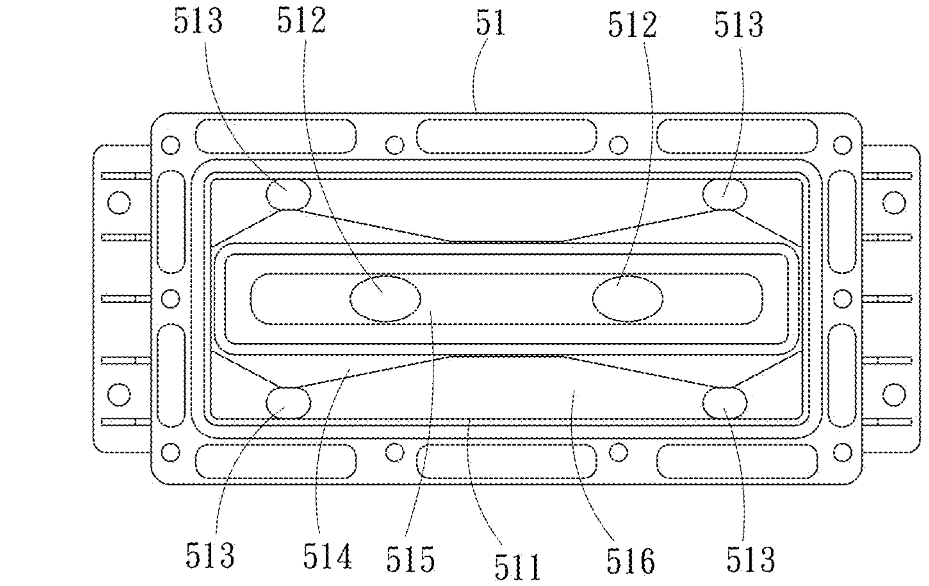
FIG. 10 is a schematic diagram of the internal flow channels of the cold plate body of the present invention.
Figure 11:
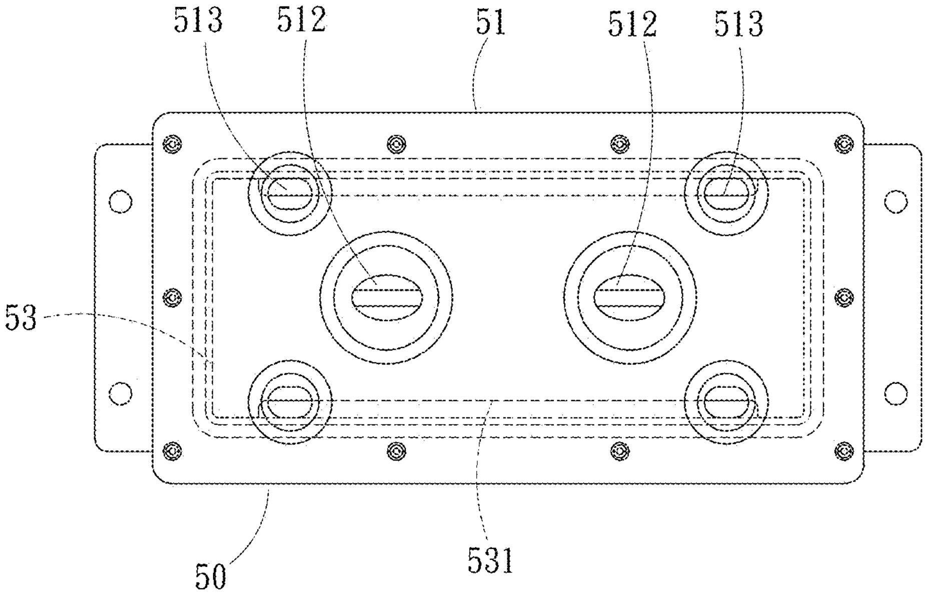
FIG. 11 is a top view of the cold plate of the present invention.

Referring to FIG. 9 to FIG. 11, the cold plate 50 is a component used to contact the processor for cooling. It comprises a cold plate body 51 and a heat dissipation base 52. The cold plate body 51 is fixed on the bottom surface of the second liquid box 20 through screws. The bottom surface of the cold plate body 51 is provided with an upwardly concave liquid chamber 511, two second cold liquid inlets 512 respectively connected with the two first cold liquid inlets 251, and two second hot liquid outlets 513 respectively connected with the two first hot liquid outlets 241. The heat dissipation base 52 comprises a bottom plate 521, and a plurality of micro water channels 522 formed on the top surface of the bottom plate 521. The bottom plate 521 is locked to the bottom surface of the cold plate body 51 through screws and seals the liquid chamber 511, so that the micro water channels 522 are located in the liquid chamber 511, so that cold liquid can flow through the micro water channels 522 for balanced cooling (heat exchange).

The above-mentioned cold plate 50 preferably also comprises a liquid separation plate 53, which is disposed in the liquid chamber 511 of the cold plate body 51. The liquid separation plate 53 is provided with strip-like through holes 531 in the middle and on both sides. The flow direction of the above-mentioned micro water channels 522 is perpendicular to the strip-like through holes 531, so that the cold liquid evenly flows into the center of the micro water channels 522 through the strip-like through hole 531 in the middle of the liquid separation plate 53. Then, the cold liquid flows through the micro water channels 522 to the strip-like through holes 531 on both sides of the liquid separation plate 53, thereby achieving the effect of fully and evenly cooling the heat dissipation base 52. The top wall of the liquid chamber 511 of the cold plate body 51 has a downward protrusion 514, and the protrusion 514 is recessed upward into a strip-like groove 515. The two second cold liquid inlets 512 are connected to the strip-like groove 515 respectively. An annular flow channel 516 is formed between the surroundings of the protrusion 514 and the inner walls of the liquid chamber 511, and the two second hot liquid outlets 513 are respectively connected to the annular flow channel 516.

Figure 13:
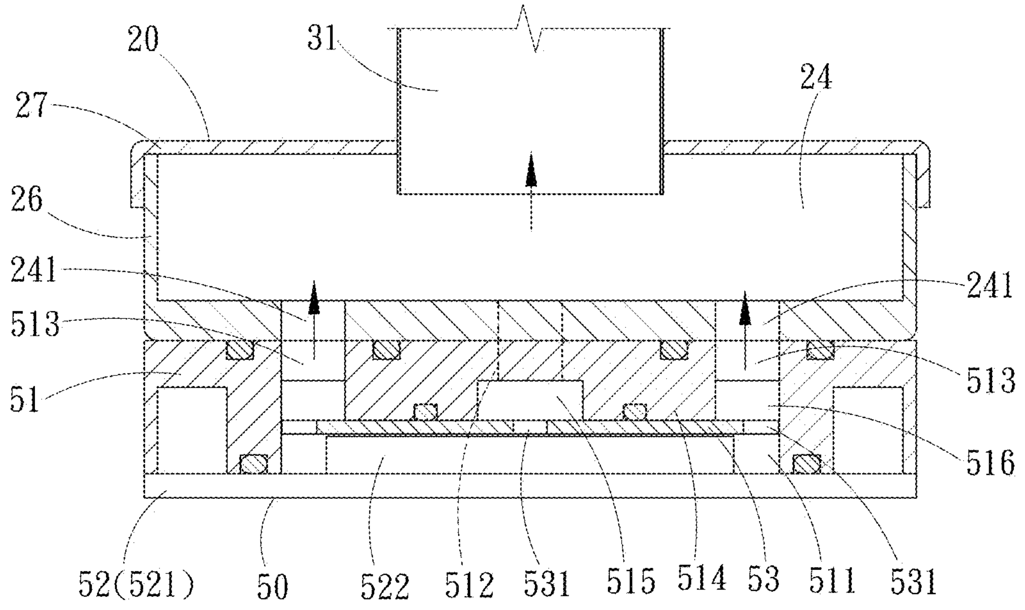
FIG. 13 is a schematic side cross-sectional view of the hot liquid in the cold plate flowing into the second liquid box of the present invention.

Referring to FIG. 4 and FIG. 12, when the liquid flows, the cold liquid in the two cold liquid chambers 25 of the second liquid box 20 respectively flows through the first cold liquid inlets 251 and the second cold liquid inlets 512 into the liquid chamber 511 of the cold plate 50. The cold liquid then flows through the strip-like through holes 531 of the liquid separation plate 53 to the micro water channels 522 on the heat dissipation base 52 to cool the processor (heat exchange) and become hot liquid. Referring again to FIG. 13, the hot liquid will flow to the surrounding annular flow channel 516, and then flow to the hot liquid chambers 24 of the second liquid box 20 through the two second hot liquid outlets 513, and then flow to the first liquid box 10 through the plurality of first radiator tubes 31, and then flow back to the two cold liquid chambers 25 of the second liquid box 20 through the plurality of second radiator tubes 32 (as shown in FIG. 4 and FIG. 12). This completes a cooling and heat dissipation cycle.

Referring again to FIG. 1 to FIG. 3, two outer frames 60 are provided between the first liquid box 10 and the second liquid box 20 of the cooling radiator 100. The two outer frames 60 are located on both sides of the radiator tube set 30. Two fans 70 can be respectively locked on the front and rear sides of the cooling radiator 100 between the two outer frames 60. The fans 70 supply air through the radiator tube set 30, so that the airflow passes through the first radiator tubes 31 and the second radiator tubes 32 to quickly dissipate heat.

When the present invention is used, two liquid pumps 40 are used to drive the liquid in the two liquid circulation systems of the cooling radiator 100 to circulate into the cold plate 50. When one of the liquid pumps 40 ages and causes the operating speed to decrease or malfunction, the liquid cooling system of the other liquid pump 40 can still be circulated to the cold plate 50 to ensure that the liquid cooling radiator can have cooling and heat dissipation functions. The structural design of the micro water channels 522 of the cold plate 50, the strip-like through holes 531 of the liquid separation plate 53 and the annular flow channel 516 of the present invention can enable the liquid in the dual liquid circulation system to flow into the cold plate 50 and fill the entire micro water channels 522, achieving that the liquid circulation systems of the two liquid pumps 40 have the function of cooling and dissipating heat for the processor. The invention has two liquid pumps and two liquid circulation systems, which can increase the flow rate of the liquid flow through the cold plate 50 and effectively solve the cooling efficiency required when the processor is overclocked or operated at a high level.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A dual-liquid pump dual-circulation integrated liquid-cooling device, comprising a cooling radiator, two liquid pumps and a cold plate, wherein said cooling radiator comprises a first liquid box, a second liquid box, and a radiator tube set, said first liquid box being internally divided into two first chambers by a first partition, each said first chamber being provided with a second partition to separate the respective said first chamber into a liquid inlet chamber and a liquid outlet chamber, each said first chamber being internally provided with a liquid pump seat, each said liquid pump seat comprises a liquid pump chamber, a liquid inlet hole connected to said liquid pump chamber and said liquid inlet chamber, and a liquid outlet hole connected to said liquid pump chamber and said liquid outlet chamber, said second liquid box being internally divided into two second chambers by a third partition, each said second chamber being internally divided into a hot liquid chamber and a cold liquid chamber by a fourth partition, said hot liquid chamber being provided with at least one first hot liquid outlet connected to said cold plate, said cold liquid chamber being provided with a first cold liquid inlet connected to said cold plate, said radiator tube set comprises a plurality of parallel first radiator tubes, second radiator tubes, and heat dissipation fins, said first radiator tubes having respective one ends thereof connected to said liquid inlet chambers of said two first chambers and respective opposite ends thereof connected to said hot liquid chambers of said two second chambers, said second radiator tubes having respective one ends thereof connected to said liquid outlet chambers of said two first chambers and respective opposite ends thereof connected to said cold liquid chambers of said two second chambers;

wherein said two liquid pumps are installed in said liquid pump chambers of said two first chambers respectively, said two liquid pumps respectively driving a hot liquid in said two hot liquid chambers of said second liquid box to flow through said first radiator tubes to said two liquid inlet chambers of said first liquid box, and then flow from said liquid inlet chambers into said liquid pump chambers respectively, and then flow to said two liquid outlet chambers of said first liquid box, and then flow through said second radiator tubes to said two cold liquid chambers of said second liquid box, allowing the hot liquid to dissipate heat through said radiator tube set and become a cold liquid; and wherein said cold plate is combined with a bottom surface of said second liquid box, said cold plate comprising a cold plate body and a heat dissipation base, said cold plate body comprising a top surface and an opposing bottom surface, the top surface of said cold plate body being combined with the bottom surface of said second liquid box, the bottom surface of said cold plate body being provided with an upwardly concave liquid chamber; said cold plate comprises two second cold liquid inlets connected to said two first cold liquid inlets, and two second hot liquid outlets connected to said two first hot liquid outlets, said heat dissipation base comprising a bottom plate and a plurality of micro water channels formed on a top surface of said bottom plate, said bottom plate being combined with the bottom surface of said cold plate body to seal said liquid chamber so that said micro water channels are located in said liquid chamber.

2. The dual-liquid pump dual-circulation integrated liquid-cooling device as claimed in claim 1, wherein said cold plate further comprises a liquid separation plate set in said liquid chamber of said cold plate body, said liquid separation plate having a middle and two lateral sides thereof respectively provided with a strip-like through hole for allowing the cold liquid to flow through said strip-like through holes to said micro water channels on said heat dissipation base.

3. The dual-liquid pump dual-circulation integrated liquid-cooling device as claimed in claim 2, wherein said liquid chamber of said cold plate body comprises a protrusion downwardly protruding from a top wall thereof, a strip-like groove recessed upward on said protrusion and connected with said two second cold liquid inlets, and an annular flow channel formed between the surroundings of said protrusion and inner walls of said liquid chamber and connected with said two second hot liquid outlets.

4. The dual-liquid pump dual-circulation integrated liquid-cooling device as claimed in claim 1, wherein each said liquid pump seat is selectively integrally formed or assembled on an inner wall of the respective said first chamber of said first liquid box; each said liquid pump chamber is recessed into the respective said liquid pump seat from the outside of said first liquid box;

each said liquid inlet hole is a circular hole located in the center of the respective said liquid pump chamber; each said liquid outlet hole is located on one side of the respective said liquid pump chamber.

5. The dual-liquid pump dual-circulation integrated liquid-cooling device as claimed in claim 3, wherein each said liquid pump comprises a liquid pump housing, a stator, and a rotor, said liquid pump housing being locked on the outside of said first liquid box through screws to seal said liquid pump chamber, said liquid pump housing comprising an annular cavity on an outer side thereof and a rotor cavity on an inner side thereof, said stator being disposed in said annular cavity of said liquid pump housing and comprising a motor coil for driving said rotor, said rotor being rotatably arranged in said rotor cavity and being provided with a plurality of fan blades so that said fan blades are rotatable in the respective said liquid pump chamber.

6. The dual-liquid pump dual-circulation integrated liquid-cooling device as claimed in claim 1, wherein said cooling radiator further comprises two outer frames set between said first liquid box and said second liquid box, and two fans respectively locked on opposite front and rear sides thereof between said two outer frames.

7. The dual-liquid pump dual-circulation integrated liquid-cooling device as claimed in claim 1, wherein said first partitions and said second partitions are welded inside said first liquid box respectively; said third partition and said fourth partitions are respectively welded inside said second liquid box.

8. The dual-liquid pump dual-circulation integrated liquid-cooling device as claimed in claim 7, wherein each said second partition comprises a recess fitted on the surface of the respective said liquid pump seat.

* * * * *